United States Patent
Nakada

(10) Patent No.: US 8,185,328 B2
(45) Date of Patent: May 22, 2012

(54) DEVICE, METHOD, AND PROGRAM FOR MEASURING SIGNAL, AND RECORDING MEDIUM

(75) Inventor: Juichi Nakada, Gunma (JP)

(73) Assignee: Advantest Corporation, Tokyo (JP)

( * ) Notice: Subject to any disclaimer, the term of this patent is extended or adjusted under 35 U.S.C. 154(b) by 827 days.

(21) Appl. No.: 12/279,433

(22) PCT Filed: Feb. 15, 2007

(86) PCT No.: PCT/JP2007/053237
§ 371 (c)(1),
(2), (4) Date: Oct. 8, 2008

(87) PCT Pub. No.: WO2007/099837
PCT Pub. Date: Sep. 7, 2007

(65) Prior Publication Data
US 2009/0055109 A1    Feb. 26, 2009

(30) Foreign Application Priority Data

Feb. 24, 2006 (JP) ................. 2006-048102

(51) Int. Cl.
G01R 15/00 (2006.01)
G01R 21/06 (2006.01)
G01R 29/26 (2006.01)
G01R 25/00 (2006.01)
H03K 9/00 (2006.01)
H04L 27/00 (2006.01)
H04L 27/06 (2006.01)

(52) U.S. Cl. ............ 702/57; 702/60; 702/66; 702/71; 324/76.77; 324/76.78; 324/88; 375/316; 375/324; 375/340

(58) Field of Classification Search .......... 702/57, 702/66, 60, 71; 324/76.77, 76.78, 88; 375/316
See application file for complete search history.

(56) References Cited

U.S. PATENT DOCUMENTS 5,343,404 A * 8/1994 Girgis .................... 702/72
(Continued)

FOREIGN PATENT DOCUMENTS

JP  62-237365 A  10/1987
(Continued)

OTHER PUBLICATIONS

English language Abstract of JP 62-237365 A.
English language Abstract and translation of JP 2005-114391 A.
English language Abstract and translation of JP 2006-005436 A.

Primary Examiner — Janet Suglo
(74) Attorney, Agent, or Firm — Greenblum & Bernstein, P.L.C.

(57) ABSTRACT

Differences in outputs from multiple terminals are easily measured. There is provided a signal measuring device for receiving signals to be measured which are generated by modulating frequency-different signals different in frequency from each other, and are respectively output from different output terminals, including a combiner which combines the signals to be measured output from the output terminals, a quadrature demodulation unit which demodulates a result of the combining carried out by the combiner, an FFT unit which represents a result of the demodulation in the frequency domain, and a characteristic measuring unit, where the characteristic measuring unit measures data for respective frequencies of the result of the demodulation, acquires output-terminal-corresponding data, which correspond to the respective output terminals, based on the data, derives characteristics of the respective output terminals based on the output-terminal-corresponding data, and acquires a difference in the characteristics between the output terminals based on the derived result.

11 Claims, 15 Drawing Sheets

U.S. PATENT DOCUMENTS

| | | | |
|---|---|---|---|
| 6,337,885 B1 * | 1/2002 | Hellberg | 375/316 |
| 6,552,995 B1 | 4/2003 | Nakada | |
| 7,323,883 B2 | 1/2008 | Nakada | |
| 7,454,175 B2 * | 11/2008 | Karabinis | 455/73 |
| 2006/0007890 A1 | 1/2006 | Yokoyama | |
| 2006/0276156 A1 | 12/2006 | Nakada et al. | |
| 2008/0018322 A1 | 1/2008 | Kurosawa et al. | |

FOREIGN PATENT DOCUMENTS

| | | |
|---|---|---|
| JP | 2005-114391 A | 4/2005 |
| JP | 2006-005436 A | 1/2006 |

* cited by examiner (a)

(b)

(a)

Ideal Output from Power Measuring Unit 26a (b)

Actual Output from Power Measuring Unit 26a

Output of Phase Error
Deriving Unit 26g

Output from First Signal Phase
Error Acquisition Unit 262h

Output from Second Signal Phase
Error Acquisition Unit 264h

Output from First Signal Phase
Error Acquisition Unit 262h

Output from Second Signal Phase
Error Acquisition Unit 264h

DEVICE, METHOD, AND PROGRAM FOR MEASURING SIGNAL, AND RECORDING MEDIUM

TECHNICAL FIELD

The present invention relates to measurement of errors among outputs from multiple antennas used for beamforming and the like.

BACKGROUND ART

Conventionally, there has been known beamforming which outputs the same signals from the multiple antennas, and also simultaneously controls the directions of the signals by adjusting the phase and the amplitude of the signals (refer to Japanese Laid-Open Patent Publication No. 2006-5436, for example).

When the same signals are to be output from the multiple antennas, the same signals are not always output. It is thus necessary to measure the signals output from the respective antennas, and, then, to measure errors among the signals.

For example, when two antennas: antenna A and antenna B, are used, following steps are required: (1) connecting the antenna A to a measuring device, and causing the measuring device to measure a signal output from the antenna A; (2) connecting the antenna B to the measuring device, and causing the measuring device to measure a signal output from the antenna B; and (3) comparing a result of the measurement of the signal output from the antenna A and a result of the measurement of the signal output from the antenna B with each other.

However, according to the above-described method, the switching of the connections, which includes connecting the antenna A to the measuring device, disconnecting the antenna A from the measuring device, and connecting the antenna B to the measuring device, takes time and effort.

It is an object of the present invention to simplify measurement of differences in outputs from multiple terminals.

DISCLOSURE OF THE INVENTION

According to the present invention, a signal measuring device for measuring signals to be measured which are generated by modulating frequency-different signals different in frequency from each other, and are respectively output from different output terminals, includes: a combining unit that combines the signals to be measured output from the output terminals; a demodulating unit that demodulates a result of the combining carried out by the combining unit; a measuring unit that measures data for respective frequencies of a result of the demodulation carried out by the demodulating unit; a corresponding data acquisition unit that acquires output-terminal-corresponding data, which correspond to the respective output terminals, based on the measured data; a characteristic deriving unit that derives characteristics of the respective output terminals based on the output-terminal-corresponding data; and a difference acquisition unit that acquires a difference in the characteristics between the output terminals based on the derived result of the characteristic deriving unit.

According to the thus constructed signal measuring device, a signal measuring device for measuring signals to be measured which are generated by modulating frequency-different signals different in frequency from each other, and are respectively output from different output terminals, can be provided.

A combining unit combines the signals to be measured output from the output terminals. A demodulating unit demodulates a result of the combining carried out by the combining unit. A measuring unit measures data for respective frequencies of a result of the demodulation carried out by the demodulating unit. A corresponding data acquisition unit acquires output-terminal-corresponding data, which correspond to the respective output terminals, based on the measured data. A characteristic deriving unit derives characteristics of the respective output terminals based on the output-terminal-corresponding data. A difference acquisition unit acquires a difference in the characteristics between the output terminals based on the derived result of the characteristic deriving unit.

According to the signal measuring device of the present invention, the frequency-different signals may include a first signal having odd frequencies of frequencies arranged at an equal interval, and a second signal having even frequencies of the frequencies arranged at the equal interval.

According to the signal measuring device of the present invention, the frequency-different signals may have equal electric power with respect to each other, the data may be an electric power, the characteristic deriving unit may derive the averages of the output-terminal-corresponding data, and the difference acquisition unit may acquire a ratio between the averages.

According to the signal measuring device of the present invention, the frequency-different signals may have equal phase with respect to each other, the data may be a quantity representing the phase, the characteristic deriving unit may derive the averages of the output-terminal-corresponding data, and the difference acquisition unit may acquire a difference between the averages.

According to the signal measuring device of the present invention, the frequency-different signals may have no time lag relative to each other, the data may be a quantity representing the phase, the characteristic deriving unit may derive rates of change in the output-terminal-corresponding data in terms of frequency, and the difference acquisition unit may acquire a difference between the rates of change.

According to another aspect of the present invention, a signal measuring method for measuring signals to be measured which are generated by modulating frequency-different signals different in frequency from each other, and are respectively output from different output terminals, includes: a combining step that combines the signals to be measured output from the output terminals; a demodulating step that demodulates a result of the combining carried out by the combining step; a measuring step that measures data for respective frequencies of a result of the demodulation carried out by the demodulating step; a corresponding data acquisition step that acquires output-terminal-corresponding data, which correspond to the respective output terminals, based on the measured data; a characteristic deriving step that derives characteristics of the respective output terminals based on the output-terminal-corresponding data; and a difference acquisition step that acquires a difference in the characteristics between the output terminals based on the derived result of the characteristic deriving step.

Another aspect of the present invention is a program of instructions for execution by the computer to perform a signal measuring process in a signal measuring device for measuring signals to be measured which are generated by modulating frequency-different signals different in frequency from each other, and are respectively output from different output terminals, having: a combining unit that combines the signals to be measured output from the output terminals; and a demodulating unit that demodulates a result of the combining carried out by the combining unit, the signal measuring process including: a measuring step that measures data for respective frequencies of a result of the demodulation carried out by the demodulating unit; a corresponding data acquisition step that acquires output-terminal-corresponding data, which correspond to the respective output terminals, based on the measured data; a characteristic deriving step that derives characteristics of the respective output terminals based on the output-terminal-corresponding data; and a difference acquisition step that acquires a difference in the characteristics between the output terminals based on the derived result of the characteristic deriving unit.

Another aspect of the present invention is a computer-readable medium having a program of instructions for execution by the computer to perform a signal measuring process in a signal measuring device for measuring signals to be measured which are generated by modulating frequency-different signals different in frequency from each other, and are respectively output from different output terminals, having: a combining unit that combines the signals to be measured output from the output terminals; and a demodulating unit that demodulates a result of the combining carried out by the combining unit, the signal measuring process including: a measuring step that measures data for respective frequencies of a result of the demodulation carried out by the demodulating unit; a corresponding data acquisition step that acquires output-terminal-corresponding data, which correspond to the respective output terminals, based on the measured data; a characteristic deriving step that derives characteristics of the respective output terminals based on the output-terminal-corresponding data; and a difference acquisition step that acquires a difference in the characteristics between the output terminals based on the derived result of the characteristic deriving unit.

BRIEF DESCRIPTION OF THE DRAWINGS

FIG. 4 is a functional block diagram showing a configuration of a quadrature modulation unit 16a;

BEST MODE FOR CARRYING OUT THE INVENTION

A description will now be given of embodiments of the present invention with reference to drawings.

Figure 1:
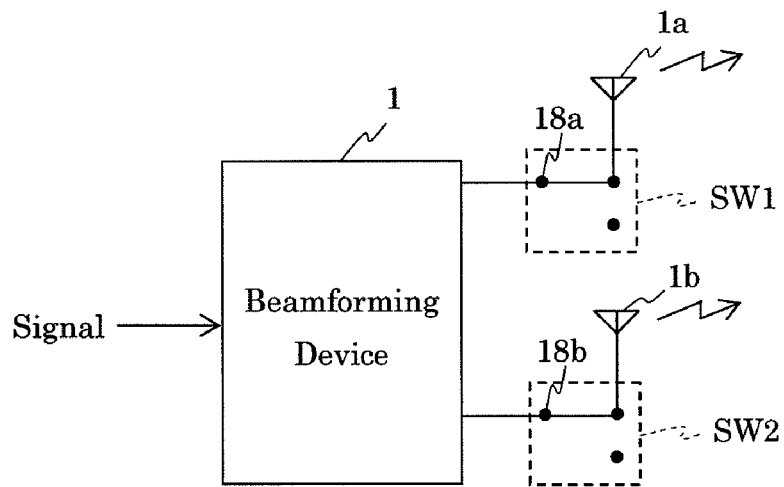
FIG. 1 illustrates a beamforming device 1 which is to be measured by a transmission signal measuring device 2 according to an embodiments of the present invention.
Figure 1:
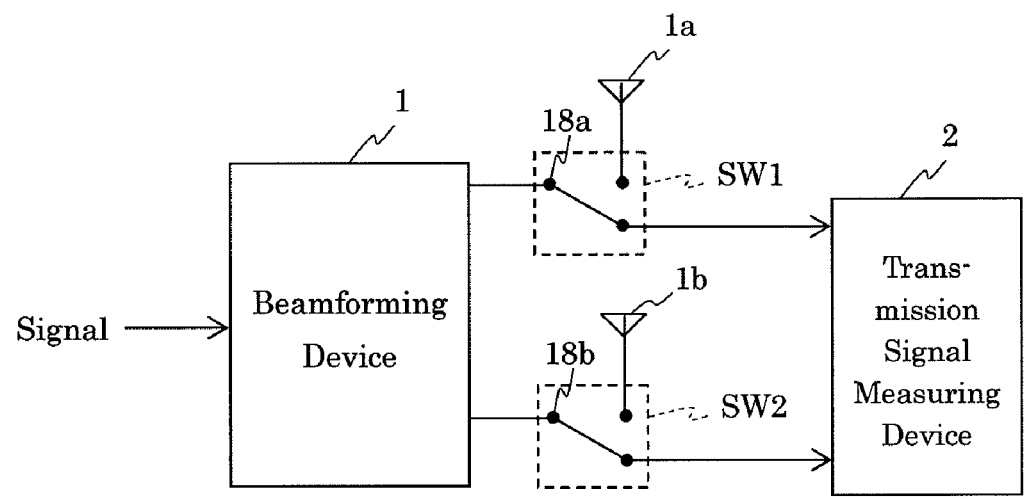

FIG. 1 illustrates a beamforming device 1 which is to be measured by a transmission signal measuring device 2 according to the embodiments of the present invention.

FIG. 1(a) shows an overview of the beamforming device 1. The beamforming device 1 receives a signal, and splits the signal into two same signals. The beamforming device 1 further transmits these two split signals from an output terminal 18a and an output terminal 18b. It should be noted that the beamforming device 1 controls the travel direction of the signals by adjusting the phase and amplitude of the signals transmitted from the output terminals 18a and 18b. This operation carried out by the beamforming device 1 is referred to as beamforming.

The signal is transmitted from the output terminal 18a to an antenna 1a via a switch SW1. Then, the signal is output from the antenna 1a. The signal is transmitted from the output terminal 18b to an antenna 1b via a switch SW2. Then, the signal is output from the antenna 1b.

On this occasion, the signal output from the antenna 1a and the signal output from the antenna 1b are the same to each other. Therefore, the power and the phase of the signal output from the antenna 1a and the power and the phase of the signal output from the antenna 1b are essentially the same. Moreover, between the signal output from the antenna 1a and the signal output from the antenna 1b, there is not essentially a time lag, and thus, causing no difference in delay.

However, the power and the phase of the signal output from the antenna 1a and the power and the phase of the signal output from the antenna 1b are actually different. Moreover, between the signal output from the antenna 1a and the signal output from the antenna 1b, there is a time lag, and thus, causing a difference in delay.

As a result, it is necessary to calibrate the beamforming device 1 by measuring the differences in power, phase, and delay. Therefore, the transmission signal measuring device 2 is necessary for measuring the signals output from the beamforming device 1.

FIG. 1(b) illustrates a state in which the beamforming device 1 is connected to the transmission signal measuring device 2. The switch SW1 connects the output terminal 18a to the transmission signal measuring device 2. The switch SW2 connects the output terminal 18b to the transmission signal measuring device 2. In this state, the transmission signal measuring device 2 receives the signal to be measured output from the output terminal 18a and the signal to be measured output from the output terminal 18b, and determines differences in characteristics between the output terminals 18a and 18b.

Figure 2:
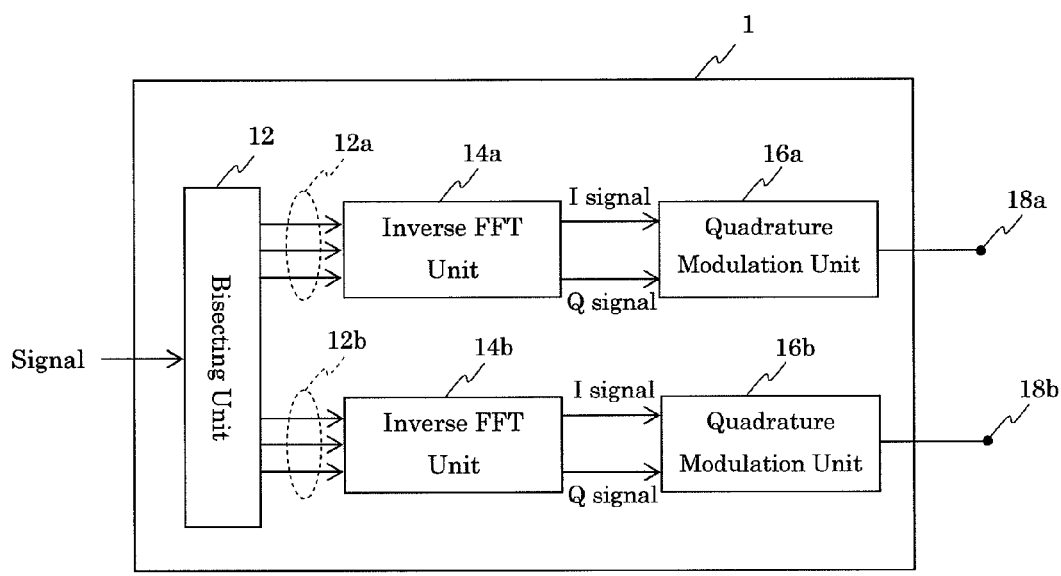
FIG. 2 is a functional block diagram showing a configuration of the beamforming device 1.

FIG. 2 is a functional block diagram showing a configuration of the beamforming device 1. The beamforming device 1 includes a bisecting unit 12, inverse FFT units 14a and 14b, quadrature modulation units 16a and 16b, and the output terminals 18a and 18b.

Figure 3:
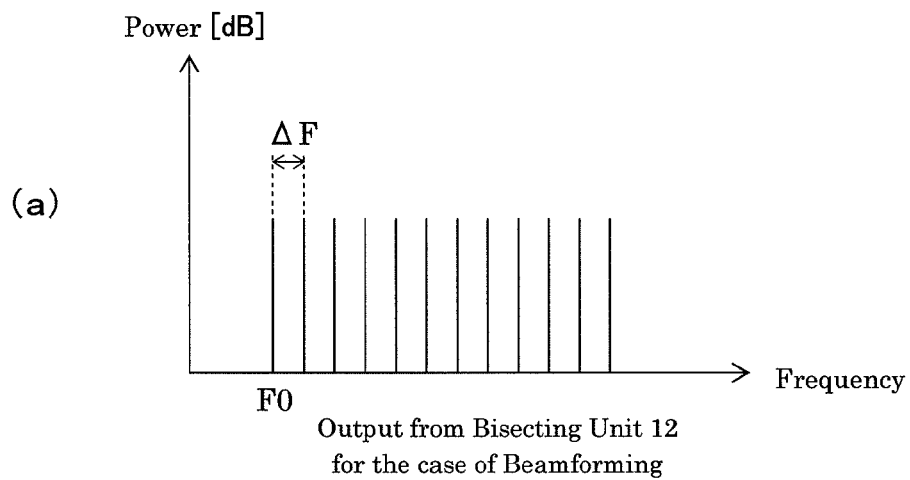
FIG. 3 shows outputs from the bisecting unit 12 for the case of the beamforming (FIG. 3(a)), and for the case in which the beamforming device 1 is connected to the transmission signal measuring device 2 (FIGS. 3(b) and 3(c))
Figure 3:
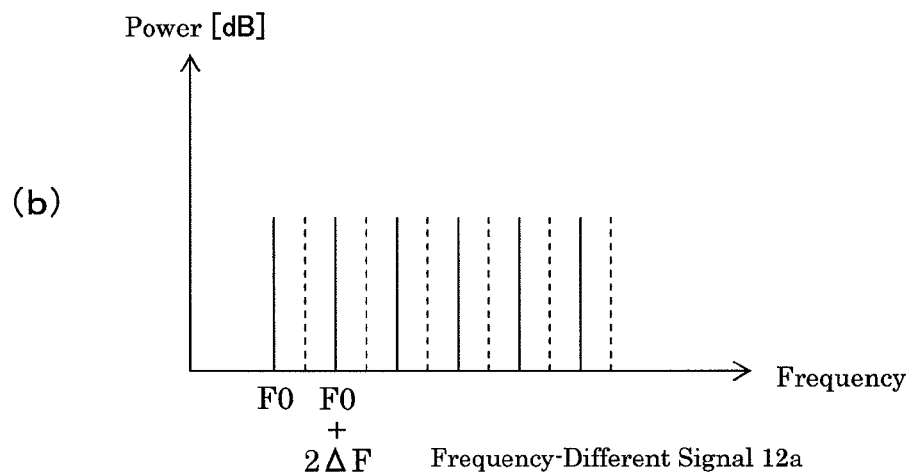
Figure 3:
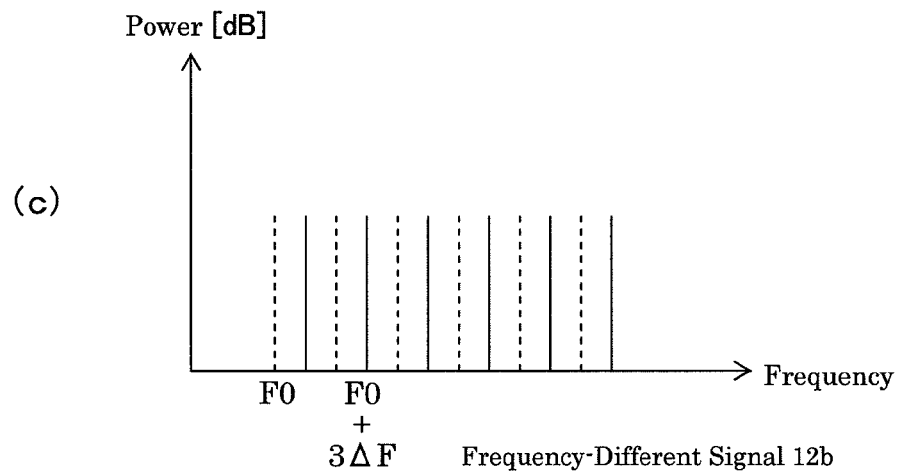

FIG. 3 shows outputs from the bisecting unit 12 for the case of the beamforming (FIG. 3(a)), and for the case in which the beamforming device 1 is connected to the transmission signal measuring device 2 (FIGS. 3(b) and 3(c)). It should be noted that signals represented by dotted lines in FIGS. 3(b) and 3(c) are not actually output.

The bisecting unit 12 receives a signal, and bisects the signal into a signal fed to the inverse FFT unit 14a and a signal fed to the inverse FFT unit 14b. The signals output from the bisecting unit 12 are different between a case (a) in which the beamforming device 1 performs the beamforming, and a case (b) in which the beamforming device 1 is connected to the transmission signal measuring device 2. Thus, a description will be respectively given of the case (a) and the case (b).

(a) A Case where the Beamforming Device 1 Performs the Beamforming

When the beamforming is performed, the signal fed to the inverse FFT unit 14a and the signal fed to the inverse FFT unit 14b are the same. As a result, the signal output from the output terminal 18a and the signal output from the output terminal 18b can be the same. However, as describe above, there are actually generated differences in power, phase, and delay.

The beamforming specified by IEEE 802.11n employs the OFDM (Orthogonal Frequency Division Multiplexing), and the signal fed to the inverse FFT unit 14a and the signal fed to the inverse FFT unit 14b are assigned to multiple carriers (frequencies).

As shown in FIG. 3(a), these carriers have evenly-spaced frequencies arranged at an equal interval, for example. For example, the carrier frequency can be represented as $F0+n\times\Delta F$ (F0: constant, n: integer equal to or more than 0, and $\Delta F$: interval between the frequencies). When the beamforming is performed, carriers used by the signal fed to the inverse FFT unit 14a and carriers used by the signal fed to the inverse FFT unit 14b are the same.

Moreover, the bisecting unit 12 sets the power and the phase of the signal fed to the inverse FFT unit 14a and the power and the phase of the signal fed to the inverse FFT unit 14b. As a result, the power and the phase of the signal output from the output terminal 18a and the signal output from the output terminal 18b can be set.

(b) A case where the Beamforming Device 1 is Connected to the Transmission Signal Measuring Device 2

On the other hand, when the beamforming device 1 is connected to the transmission signal measuring device 2, carriers used by the signal fed to the inverse FFT unit 14a and carriers used by the signal fed to the inverse FFT unit 14b are different. On this occasion, the outputs from the bisecting unit 12 are respectively referred to as frequency-different signals 12a and 12b when the beamforming device 1 is connected to the transmission signal measuring device 2 (refer to FIG. 2). Thus, the frequency-different signals 12a and 12b have frequencies different from each other. The frequency-different signal 12a is fed to the inverse FFT unit 14a. The frequency-different signal 12b is fed to the inverse FFT unit 14b.

As shown in FIG. 3(b), the frequencies assigned to the frequency-different signal 12a are represented as $F0'n1\times\Delta F$ (n1=2 n=0, 2, 4, ...). They are odd frequencies of the evenly-spaced frequencies $F0'n\times\Delta F$ (first signal). As shown in FIG. 3(c), the frequencies assigned to the frequency-different signal 12b are represented as $F0'n2\times\Delta F$ (n2=2 n+1=1, 3, 5, ...). They are even frequencies of the evenly-spaced frequencies $F0+n\times\Delta F$ (second signal).

The inverse FFT unit 14a receives the output from the bisecting unit 12 (frequency-different signal 12a when the beamforming device 1 is connected to the transmission signal measuring device 2). Moreover, the inverse FFT unit 14a transforms the output received from the bisecting unit 12 by means of the inverse FFT, thereby representing the output from the bisecting unit 12 in the time domain, and feeds to the quadrature modulation unit 16a. It should be noted that the output from the inverse FFT unit 14a includes an I signal and a Q signal.

The inverse FFT unit 14b receives the output of the bisecting unit 12 (frequency-different signal 12b when the beamforming device 1 is connected to the transmission signal measuring device 2). Moreover, the inverse FFT unit 14b transforms the output received from the bisecting unit 12 by means of the inverse FFT, thereby representing the output from the bisecting unit 12 in the time domain, and feeds to the quadrature modulation unit 16b. It should be noted that the output from the inverse FFT unit 14b includes an I signal and a Q signal.

The quadrature modulation unit 16a receives the output from the inverse FFT unit 14a, and carries out the quadrature modulation. The output received from the quadrature modulation unit 16a is fed to the output terminal 18a. When the beamforming device 1 is connected to the transmission signal measuring device 2, the signal fed to the output terminal 18a is a signal to be measured.

The quadrature modulation unit 16b receives the output from the inverse FFT unit 14b, and carries out the quadrature modulation. The output received from the quadrature modulation unit 16b is fed to the output terminal 18b. When the beamforming device 1 is connected to the transmission signal measuring device 2, the signal fed to the output terminal 18b is a signal to be measured.

The previous description is provided while assuming that the bisecting unit 12 outputs two signals. However, the bisecting unit 12 may output N signals (N is a natural number equal to or more than 3). In this case, N of the inverse FFT units 14, the quadrature modulation units 16, and the output terminals 18 are respectively necessary. Moreover, the output frequencies of the bisecting unit 12 are represented as $F0+m\times N\times\Delta F$, $F0+(m\times N+1)\times\Delta F$, $F0+(m\times N+2)\times\Delta F$, ..., $F0+(m\times N+N-2)\times\Delta F$, $F0+(m\times N+N-1)\times\Delta F$ (m is an integer equal to or more than 0). These signals are transformed by means of the inverse FFT, are modulated by means of the quadrature modulation, and are respectively output from different output terminals.

For example, when N is four, four of the inverse FFT units 14, the quadrature modulation units 16, and the output terminals 18 are respectively necessary. Moreover, the output frequencies of the bisecting unit 12 are represented as $F0+m\times 4\times\Delta F$, $F0+(m\times 4+1)\times\Delta F$, $F0+(m\times 4+2)\times\Delta F$, and $F0+(m\times 4+3)\times\Delta F$. A signal with the frequencies of $F0+m\times 4\times\Delta F$, a signal with the frequencies of $F0+(m\times 4+1)\times\Delta F$, a signal with the frequencies of $F0+(m\times 4+2)\times\Delta F$, and a signal with the frequencies of $F0+(m\times 4+3)\times\Delta F$ are transformed by means of the inverse FFT, are modulated by means of the quadrature modulation, and are respectively output from the output terminals.

Figure 4:
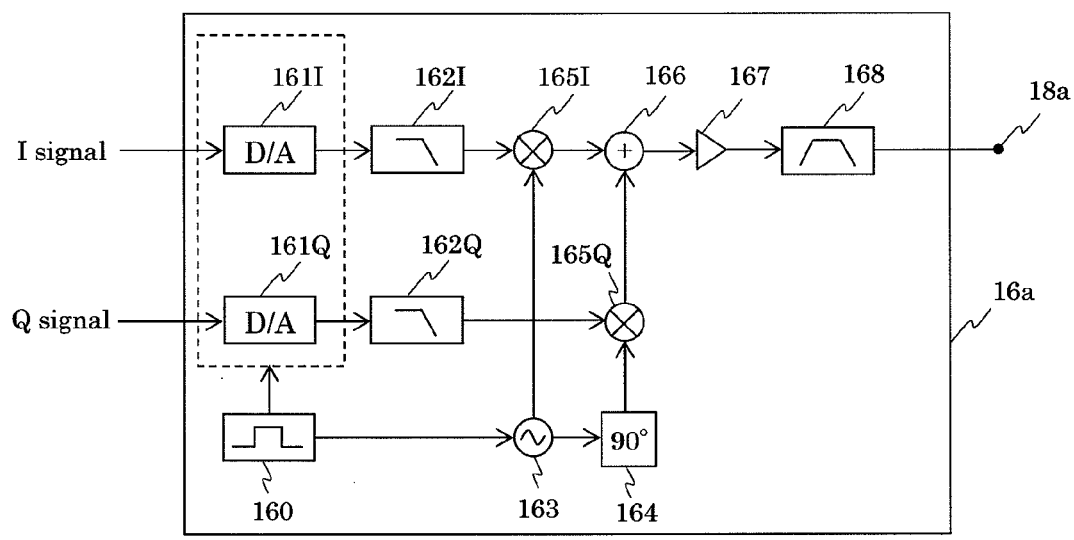

FIG. 4 is a functional block diagram showing a configuration of the quadrature modulation unit 16a. The quadrature modulation unit 16a includes a clock signal source 160, D/A converters 161I and 161Q, low-pass filters 162I and 162Q, a local signal source 163, a 90-degree phase sifter 164, multipliers 165I and 165Q, an adder 166, an amplifier 167, and a band-pass filter 168. A configuration of the quadrature modulation unit 16b is the same as that of the quadrature modulation unit 16a, and hence description thereof is omitted.

The clock signal source 160 feeds a clock signal to the D/A converters 161I and 161Q, and the local signal source 163.

The D/A converter 161I converts the I signal output from the inverse FFT unit 14a into an analog signal. The D/A converter 161Q converts the Q signal output from the inverse FFT unit 14a into an analog signal. It should be noted that the D/A converters 161I and 161Q carry out the conversion into the analog signal using the clock signal.

The low-pass filter 162I passes a low frequency band component of the output from the D/A converter 161I. The low-pass filter 162Q passes a low frequency band component of the output from the D/A converter 161Q.

Though, ideally, group delays of the low-pass filters 162I and 162Q of the quadrature modulation unit 16a and group delays of the low-pass filters 162I and 162Q of the quadrature modulation unit 16b respectively have the same values, they are actually different. These differences cause the difference in delay between the signal output from the antenna 1a and the signal output from the antenna 1b.

Moreover, though, ideally, losses of the low-pass filters 162I and 162Q of the quadrature modulation unit 16a and losses of the low-pass filters 162I and 162Q of the quadrature modulation unit 16b respectively have the same values, they are actually different. This difference causes a difference in power between the signal output from the antenna 1a and the signal output from the antenna 1b.

The local signal source 163 generates a local signal using the clock signal.

The 90-degree phase shifter 164 changes the phase of the local signal by 90 degrees.

The multiplier 165I multiplies the output from the low-pass filter 162I and the local signal by each other, and outputs the product. The multiplier 165Q multiplies the output from the low-pass filter 162Q and the output from the 90-degree phase shifter 164 by each other, and outputs the product.

Though, ideally, an electrical length of a wire from the local signal source 163 to the multiplier 165I (multiplier 165Q) of the quadrature modulation unit 16a and an electrical length of a wire from the local signal source 163 to the multiplier 165I (multiplier 165Q) of the quadrature modulation unit 16b are equal, they are actually different. This difference causes a difference in phase between the signal output from the antenna 1a and the signal output from the antenna 1b.

The adder 166 adds the output from the multiplier 165I and the output from the multiplier 165Q to each other.

The amplifier 167 amplifies the output from the adder 166. Though, ideally, the gain of the amplifier 167 of the quadrature modulation unit 16a and the gain of the amplifier 167 of the quadrature modulation unit 16b are equal, they are actually different. This difference causes a difference in power between the signal output from the antenna 1a and the signal output from the antenna 1b.

The band-pass filter 168 extracts a component in a predetermined band from the output of the amplifier 167, and outputs the component to the output terminal 18a.

Though, ideally, the group delay of the band-pass filter 168 of the quadrature modulation unit 16a and the group delay of the band-pass filter 168 of the quadrature modulation unit 16b have the same values, they are actually different. This difference causes a difference in delay between the signal output from the antenna 1a and the signal output from the antenna 1b.

Moreover, though, ideally, the loss of the band-pass filter 168 of the quadrature modulation unit 16a and the loss of the band-pass filter 168 of the quadrature modulation unit 16b have the same values, they are actually different. This difference causes a difference in power between the signal output from the antenna 1a and the signal output from the antenna 1b.

The output terminal 18a outputs the signal (signal to be measured when the beamforming device 1 is connected to the transmission signal measuring device 2) obtained by transforming the output (the frequency-different signal 12a when the beamforming device 1 is connected to the transmission signal measuring device 2) from the bisecting unit 12 into the signals represented in the time domain by the inverse FFT unit 14a, and modulating the signals by the quadrature modulation unit 16a. The signal to be measured is generated by modulating the frequency-different signal 12a by the quadrature modulation unit 16a.

The output terminal 18b outputs the signal (signal to be measured when the beamforming device 1 is connected to the transmission signal measuring device 2) obtained by transforming the output (the frequency-different signal 12b when the beamforming device 1 is connected to the transmission signal measuring device 2) of the bisecting unit 12 into the signals represented in the time domain by the inverse FFT unit 14b, and modulating the signals by the quadrature modulation unit 16b. The signal to be measured is generated by modulating the frequency-different signal 12b by the quadrature modulation unit 16b.

It should be noted that the signals to be measured output from the output terminals 18a and 18b are the repeated OFDM symbols. The OFDM symbol without a guard interval is preferable for easy measurement carried out by the transmission signal measuring device 2.

Figure 5:
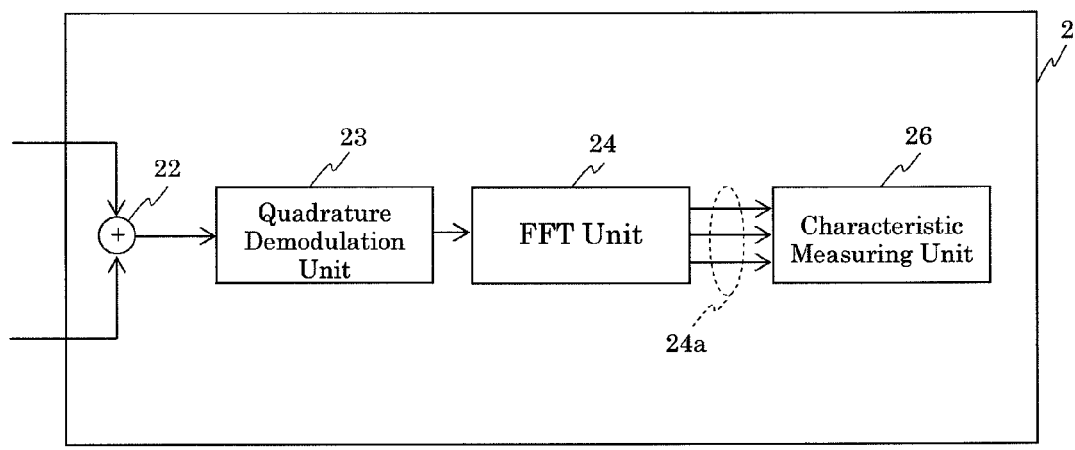
FIG. 5 is a functional block diagram showing a configuration of the transmission signal measuring device 2 according to the embodiments of the present invention.

FIG. 5 is a functional block diagram showing a configuration of the transmission signal measuring device 2 according to the embodiments of the present invention. The transmission signal measuring device 2 includes a combiner 22, a quadrature demodulation unit 23, an FFT unit 24, and a characteristic measuring unit 26.

The combiner 22 combines the signals to be measured output from the output terminals 18a and 18b. It is assumed that the combiner 22 is calibrated as a three-terminal network of a network analyzer.

The quadrature demodulation unit 23 demodulates the output from the combiner 22 by means of the quadrature demodulation. The quadrature demodulation itself is a well-known technology, and hence detailed description of the quadrature demodulation unit 23 is omitted.

The FFT unit 24 transforms the output from the quadrature demodulation unit 23 by means of the FFT, thereby representing the output from the quadrature demodulation unit 23 in the frequency domain. As a result, a frequency-associated signal 24a associated with frequencies is output. It should be noted that the frequency-associated signal 24a is associated with the frequencies $F0+n \times \Delta F$ at the equal interval (refer to FIG. 3(*a*)).

The characteristic measuring unit 26 measures characteristics of the output terminals 18a and 18b based on the frequency-associated signal 24a. Moreover, the characteristic measuring unit 26 acquires a difference in characteristics between the output terminals 18a and 18b.

A configuration of the characteristic measuring unit 26 varies by embodiments.

FIRST EMBODIMENT

The characteristic measuring unit 26 according to a first embodiment is to measure a ratio between electric powers of the output from the output terminal 18a and the output from the output terminal 18b. It is assumed that the power of the frequency-different signal 12a and the power of the frequency-different signal 12b are equal. Moreover, it is also assumed that the powers of the respective carriers of the frequency-different signal 12a and the powers of the respective carriers of the frequency-different signal 12b are all equal (refer to FIGS. 3(b) and 3(c)). It is assumed that the bisecting unit 12 outputs the two signals.

Figure 6:
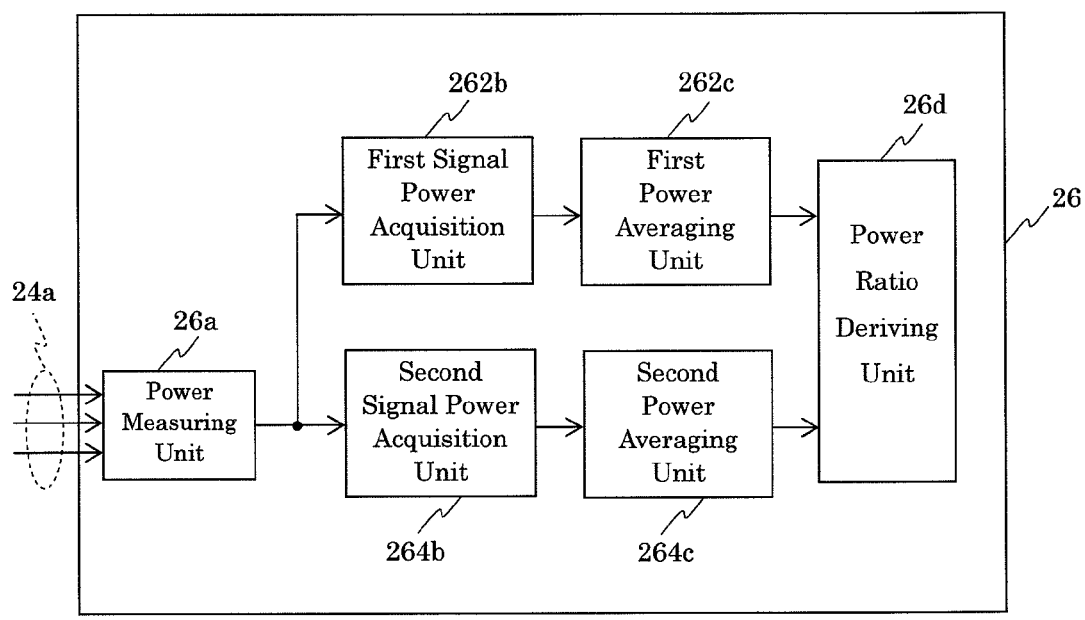
FIG. 6 is a functional block diagram showing a configuration of a characteristic measuring unit 26 according to the first embodiment.

FIG. 6 is a functional block diagram showing a configuration of the characteristic measuring unit 26 according to the first embodiment. The characteristic measuring unit 26 according to the first embodiment includes a power measuring unit (measuring means) 26a, a first signal power acquisition unit (corresponding data acquisition means) 262b, a second signal power acquisition unit (corresponding data acquisition means) 264b, a first power averaging unit (characteristic deriving means) 262c, a second power averaging unit (characteristic deriving means) 264c, and a power ratio deriving unit (difference acquisition means) 26d.

The power measuring unit (measuring means) 26a receives the frequency-associated signal 24a, and measures the powers of the respective frequencies F0+n×ΔF at the equal interval (refer to FIG. 3(a)). As a result, it is possible to measure the powers for the respective frequencies of the result of the demodulation carried out by the quadrature demodulation unit 23.

Figure 7:
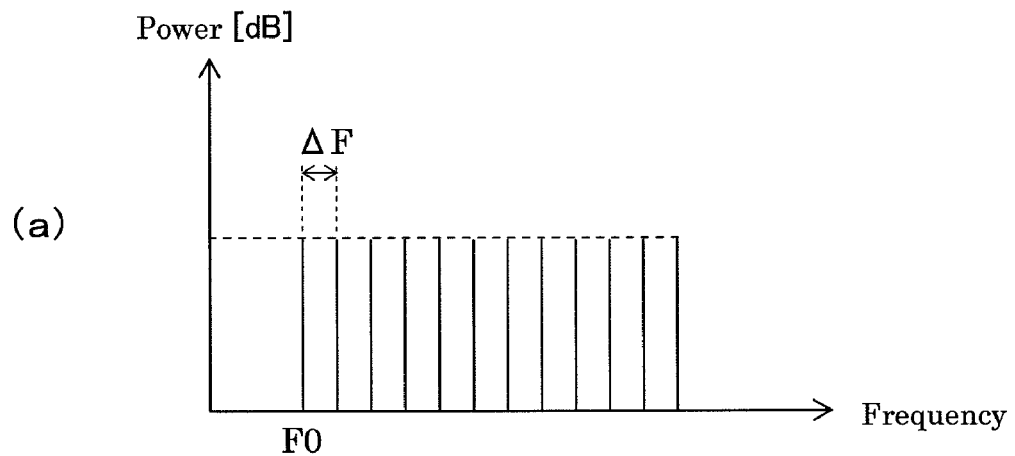
FIG. 7 shows an ideal output from a power measuring unit 26a (FIG. 7(a)) and an actual output from the power measuring unit 26a (FIG. 7(b))
Figure 7:
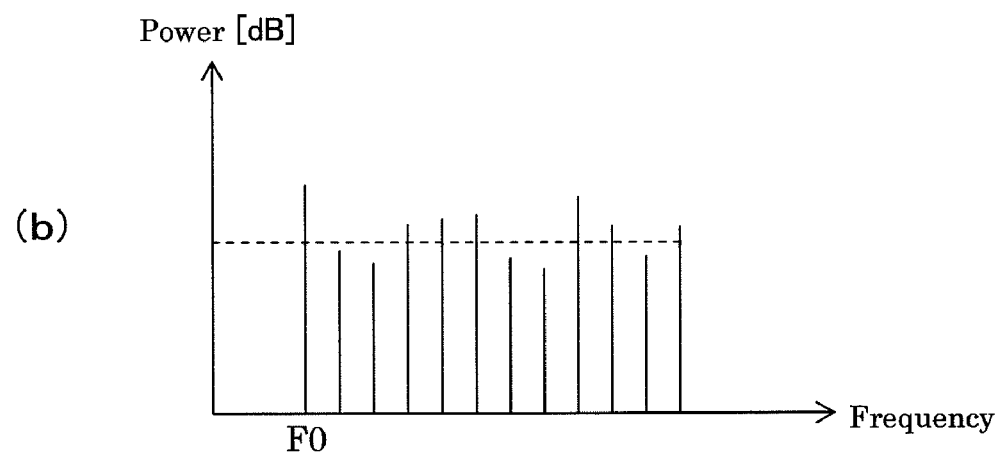

FIG. 7 shows an ideal output from the power measuring unit 26a (FIG. 7(a)) and an actual output from the power measuring unit 26a (FIG. 7(b)).

The powers of the respective carriers (F0+n×ΔF) of the frequency-different signal 12a and the powers of the respective carriers of the frequency-different signal 12b are all equal (refer to FIGS. 3(b) and 3(c)). Thus, the output from the power measuring unit 26a should present equal powers for the respective carriers as shown in FIG. 7(a). However, due to the reasons described above and the like, the output from the power measuring unit 26a represents different powers for the respective carriers as shown in FIG. 7(b).

The first signal power acquisition unit (corresponding data acquisition means) 262b acquires the power corresponding to the output terminal 18a (output-terminal-corresponding data) from the powers measured by the power measuring unit 26a. The second signal power acquisition unit (corresponding data acquisition means) 264b acquires the power corresponding to the output terminal 18b (output-terminal-corresponding data) from the powers measured by the power measuring unit 26a.

Figure 8:
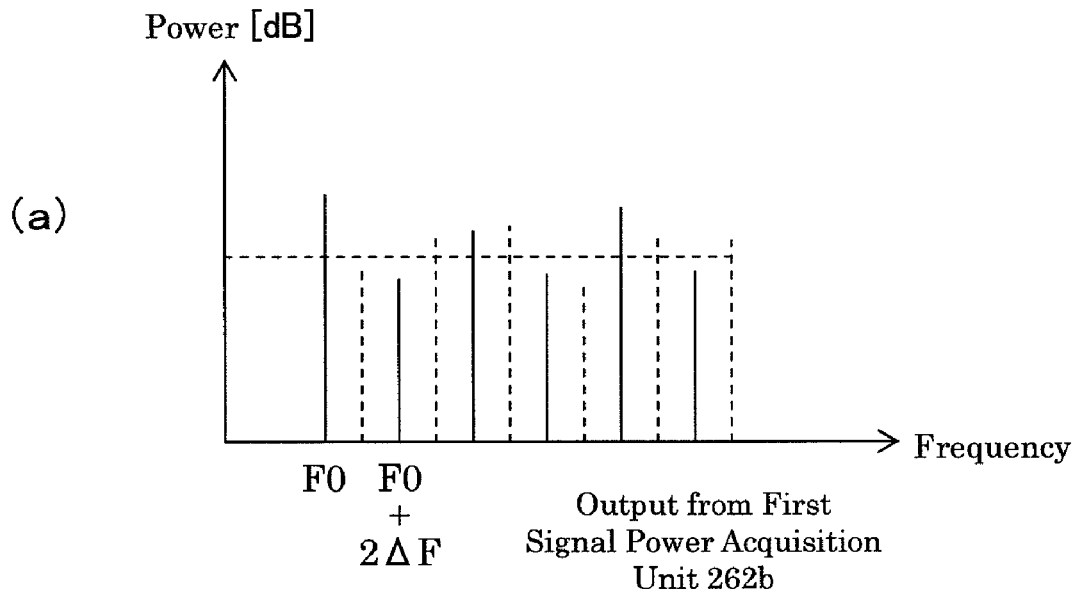
FIG. 8 shows an output from a first signal power acquisition unit 262b (FIG. 8(a)) and an output from a second signal power acquisition unit 264b (FIG. 8(b))
Figure 8:
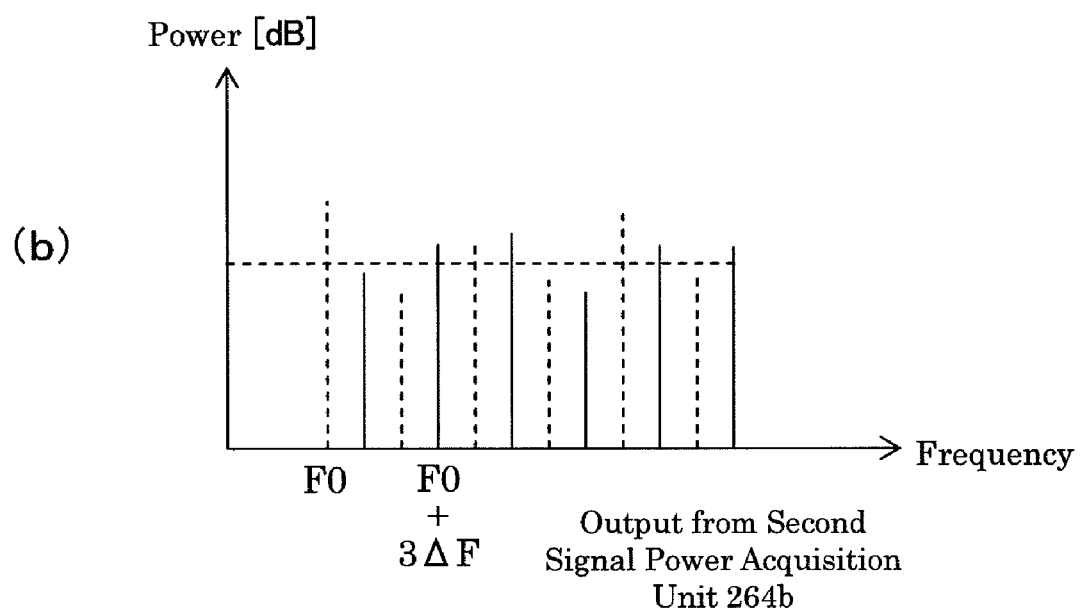

FIG. 8 shows an output from the first signal power acquisition unit 262b (FIG. 8(a)) and an output from the second signal power acquisition unit 264b (FIG. 8(b)). It should be noted that signals indicated by dotted lines in FIG. 8 are not actually output.

As shown in FIG. 8(a), the first signal power acquisition unit 262b acquires powers of the components having the frequencies F0+n1×ΔF (n1=2 n=0, 2, 4, . . . ) from the powers measured by the power measuring unit 26a. As shown in FIG. 3(b), the frequencies assigned to the frequency-different signal 12a are represented as F0+n1×ΔF, and the signal to be measured obtained by modulating the frequency-different signal 12a is output from the output terminal 18a. The first signal power acquisition unit 262b thus acquires the power corresponding to the output terminal 18a from the powers measured by the power measuring unit 26a.

As shown in FIG. 8(b), the second signal power acquisition unit 264b acquires powers of the components having the frequencies F0+n2×ΔF (n2=2 n+1=1, 3, 5, . . . ) from the powers measured by the power measuring unit 26a. As shown in FIG. 3(c), the frequencies assigned to the frequency-different signal 12b are represented as F0+n2×ΔF, and the signal to be measured obtained by modulating the frequency-different signal 12b is output from the output terminal 18b. The second signal power acquisition unit 264b thus acquires the power corresponding to the output terminal 18b from the powers measured by the power measuring unit 26a.

The first power averaging unit (characteristic deriving means) 262c averages the results acquired by the first signal power acquisition unit 262b. This average is the average of the powers corresponding to the output terminal 18a. The average of the powers corresponding to the output terminal 18a can be considered as a power characteristic of the signal output from the output terminal 18a. It is thus considered that the first power averaging unit 262c derives a power characteristic of the signal output from the output terminal 18a.

The second power averaging unit (characteristic deriving means) 264c averages the results acquired by the second signal power acquisition unit 264b. This average is the average of the powers corresponding to the output terminal 18b. The average of the powers corresponding to the output terminal 18b can be considered as a power characteristic of the signal output from the output terminal 18b. It is thus considered that the second power averaging unit 264c derives a power characteristic of the signal output from the output terminal 18b.

The power ratio deriving unit (difference acquisition means) 26d derives a ratio between the output from the first power averaging unit 262c and the output from the second power averaging unit 264c. In other words, the power ratio deriving unit 26d derives a ratio between the average of the powers corresponding to the output terminal 18a and the average of the powers corresponding to the output terminal 18b. This ratio is referred to as power ratio. The power ratio represents the difference between the power characteristic of the signal output from the output terminal 18a and the power characteristic of the signal output from the output terminal 18b. It is considered that the power ratio deriving unit 26d acquires this difference.

According to the first embodiment, the frequencies are assigned to the frequency-different signal 12a as shown in FIG. 3(b), and the frequencies are assigned to the frequency-different signal 12b as shown in FIG. 3(c). Then, the transmission signal measuring device 2 acquires the powers of the frequency components used by the frequency-different signals 12a and 12b, thereby acquiring the power ratio. As a result, since it is possible to reduce a labor for switching from the connection between the output terminal 18a and the transmission signal measuring device 2 to the connection between the output terminal 18b and the transmission signal measuring device 2, and vice versa, the difference in the outputs from the multiple terminals (output terminals 18a and 18b) can be easily measured.

The first embodiment is described assuming that the bisecting unit 12 outputs two signals. However, the first embodiment can be applied to a case in which the bisecting unit 12 outputs N of signals.

In this case, N of the power acquisition units and power averaging units are respectively necessary. Moreover, the power ratio deriving unit 26d derives ratios between the output from one power averaging unit and the output from another power averaging unit.

For example, when N=4, four of the power acquisition units: a first signal power acquisition unit (for acquiring the powers of a signal having frequencies F0+m×4×ΔF); a second signal power acquisition unit (for acquiring the powers of a signal having frequencies F0+(m×4+1)×ΔF); a third signal power acquisition unit (for acquiring the powers of a signal having frequencies F0+(m×4+2)×ΔF); and a fourth signal power acquisition unit (for acquiring the powers of a signal having frequencies F0+(m×4+3)×ΔF) are necessary. The signal with the frequencies of F0+m×4×ΔF, the signal with the frequencies of F0+(m×4+1)×ΔF, the signal with the frequencies of F0+(m×4+2)×ΔF, and the signal with the frequencies of F0+(m×4+3)×ΔF are respectively output from different output terminals. Thus, the power acquisition units acquire the powers corresponding to the respective output terminals (output-terminal-corresponding data).

Moreover, four of the power averaging units: a first signal power averaging unit (for averaging results acquired by the first signal power acquisition unit); a second signal power averaging unit (for averaging results acquired by the second signal power acquisition unit); a third signal power averaging unit (for averaging results acquired by the third signal power acquisition unit); and a fourth signal power averaging unit (for averaging results acquired by the fourth signal power acquisition unit), are necessary.

Further, the power ratio deriving unit 26d derives ratios between the output from one power averaging unit (such as the first signal power averaging unit) and the output from another power averaging unit (such as the third signal power averaging unit).

SECOND EMBODIMENT

The characteristic measuring unit 26 according to the second embodiment is to measure a difference in phase between the output from the output terminal 18a and the output from the output terminal 18b. It is assumed that the phase of the frequency-different signal 12a and the phase of the frequency-different signal 12b are equal. Phases of the respective frequencies of the frequency-different signals 12a and 12b are preferably set such that the PAPR (Peak to Average Power Ratio) of the signal transformed by means of the inverse FFT by the inverse FFT units 14a and 14b is low. It is assumed that the bisecting unit 12 outputs the two signals.

Figure 9:
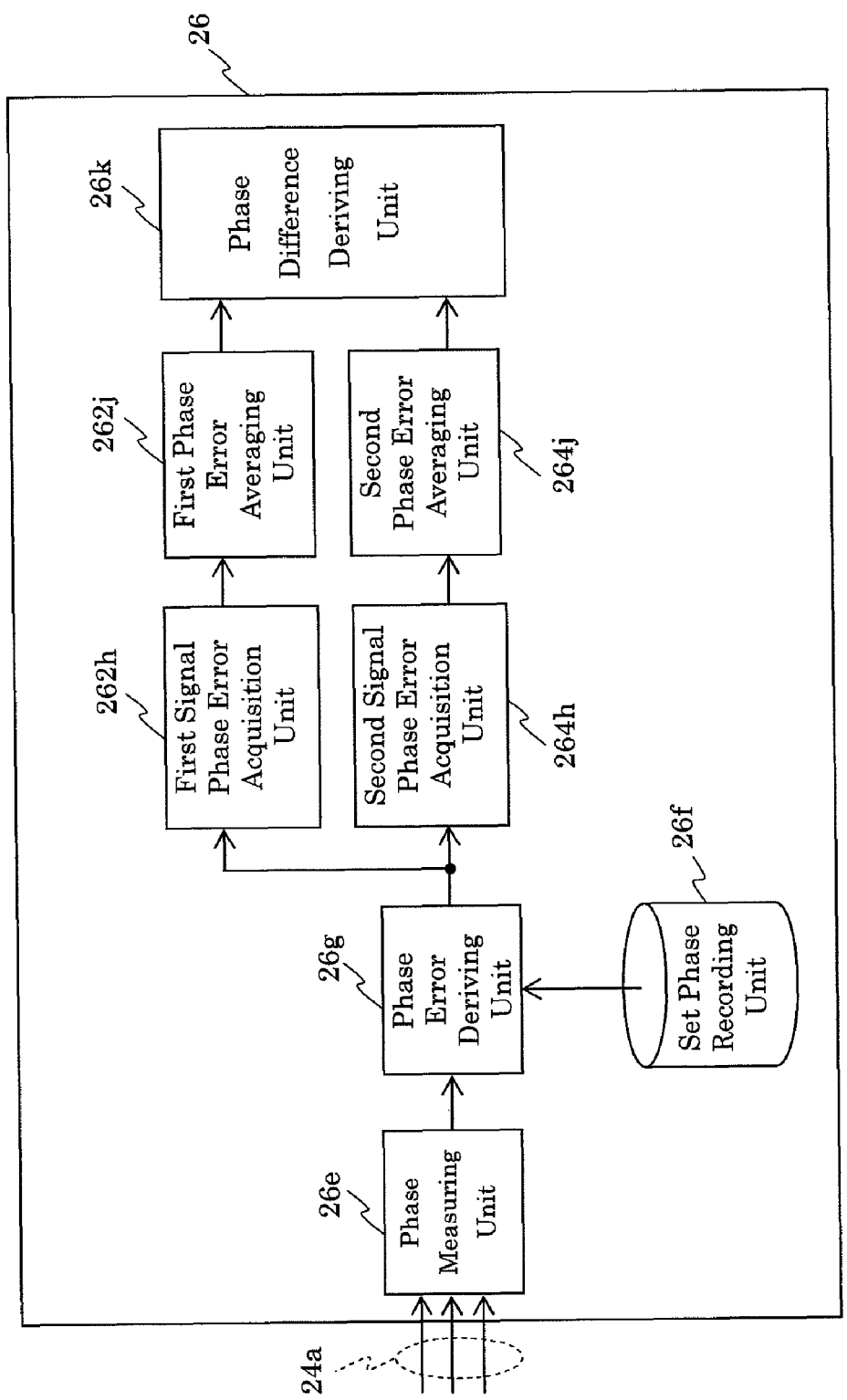
FIG. 9 is a functional block diagram showing a configuration of the characteristic measuring unit 26 according to the second embodiment.

FIG. 9 is a functional block diagram showing a configuration of the characteristic measuring unit 26 according to the second embodiment. The characteristic measuring unit 26 according to the second embodiment includes a phase measuring unit (measuring means) 26e, a set phase recording unit (measuring means) 26f, a phase error deriving unit (measuring means) 26g, a first signal phase error acquisition unit (corresponding data acquisition means) 262h, a second signal phase error acquisition unit (corresponding data acquisition means) 264h, a first phase error averaging unit (characteristic deriving means) 262j, a second phase error averaging unit (characteristic deriving means) 264j, and a phase difference deriving unit (difference acquisition means) 26k.

The phase measuring unit 26e receives the frequency-associated signal 24a, and measures phases of the respective frequencies F0+n×ΔF at the equal interval (refer to FIG. 3(a)). As a result, it is possible to measure the phases of the respective frequencies of the result of the demodulation carried out by the quadrature demodulation unit 23.

The set phase recording unit 26f records the phase of the signal to be output from the output terminal 18a, which phase is set by the bisecting unit 12 (referred to as "set phase").

The phase error deriving unit 26g derives a difference between the phase measured by the phase measuring unit 26e and the set phase (referred to as "phase error"). The phase error can be considered as a quantity representing a phase of the respective frequencies of the result of the demodulation by the quadrature demodulation unit 23. It should be noted that the quantity representing the phase is not limited to the phase error, and may be the phase itself, for example.

The phase measuring unit 26e, the set phase recording unit 26f, and the phase error deriving unit 26g serve as measuring means for measuring the quantities representing the phases of the respective frequencies of the result of the demodulation by the quadrature demodulation unit 23.

Figure 10:
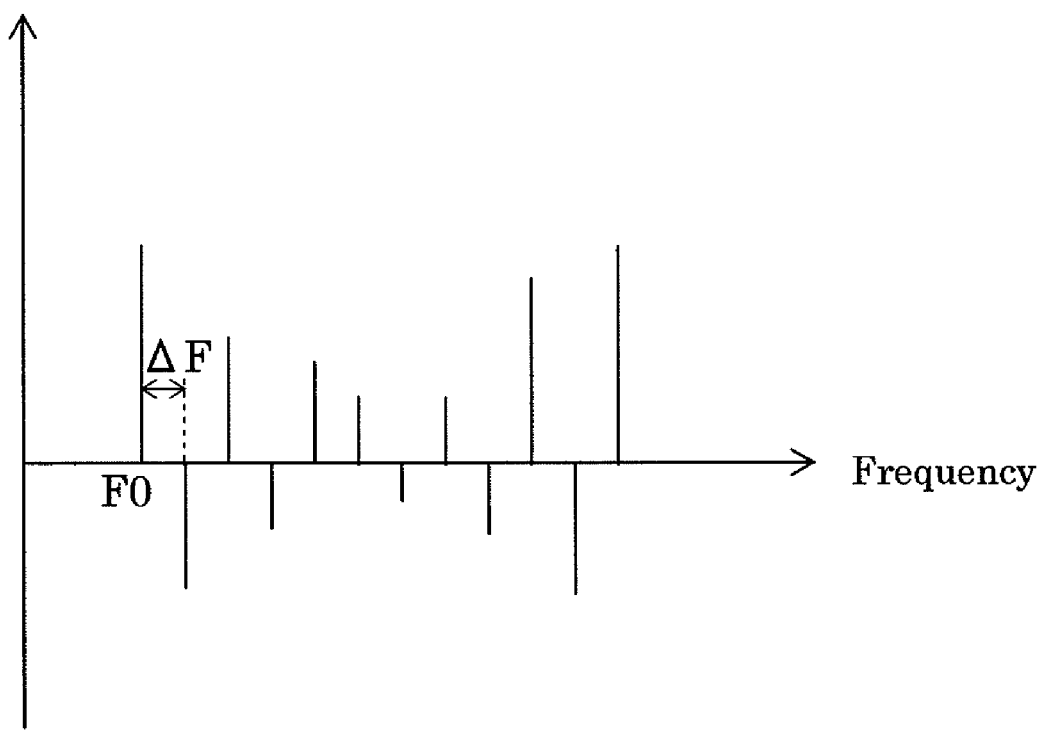
FIG. 10 shows an actual output of a phase error deriving unit 26g.

FIG. 10 shows an actual output of the phase error deriving unit 26g. Ideally, the phase error should be zero for any of the frequencies. However, due to the above-described reasons and the like, as shown in FIG. 10, the phase errors are not zero.

The first signal phase error acquisition unit (corresponding data acquisition means) 262h acquires the phase error (output-terminal-corresponding data) corresponding to the output terminal 18a from the phase errors measured by the phase measuring unit 26e, the set phase recording unit 26f, and the phase error deriving unit 26g. The second signal phase error acquisition unit (corresponding data acquisition means) 264h acquires the phase error (output-terminal-corresponding data) corresponding to the output terminal 18b from the phase errors measured by the phase measuring unit 26e, the set phase recording unit 26f, and the phase error deriving unit 26g.

Figure 11:
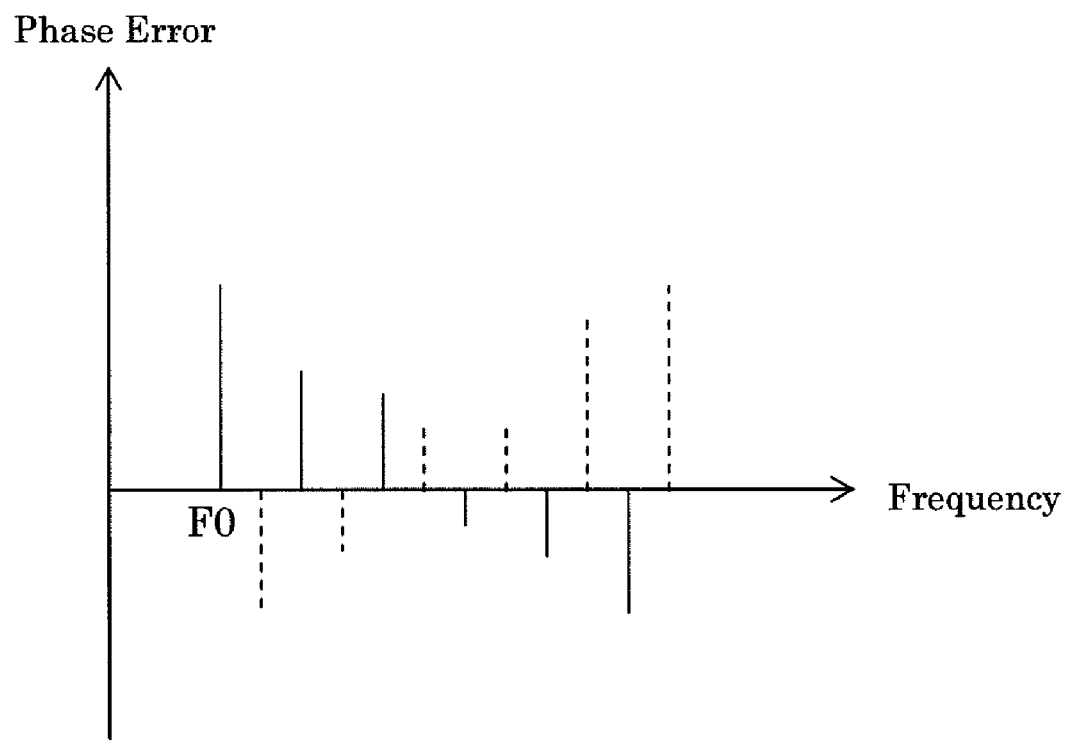
FIG. 11 shows an output from a first signal phase error acquisition unit 262h.
Figure 12:
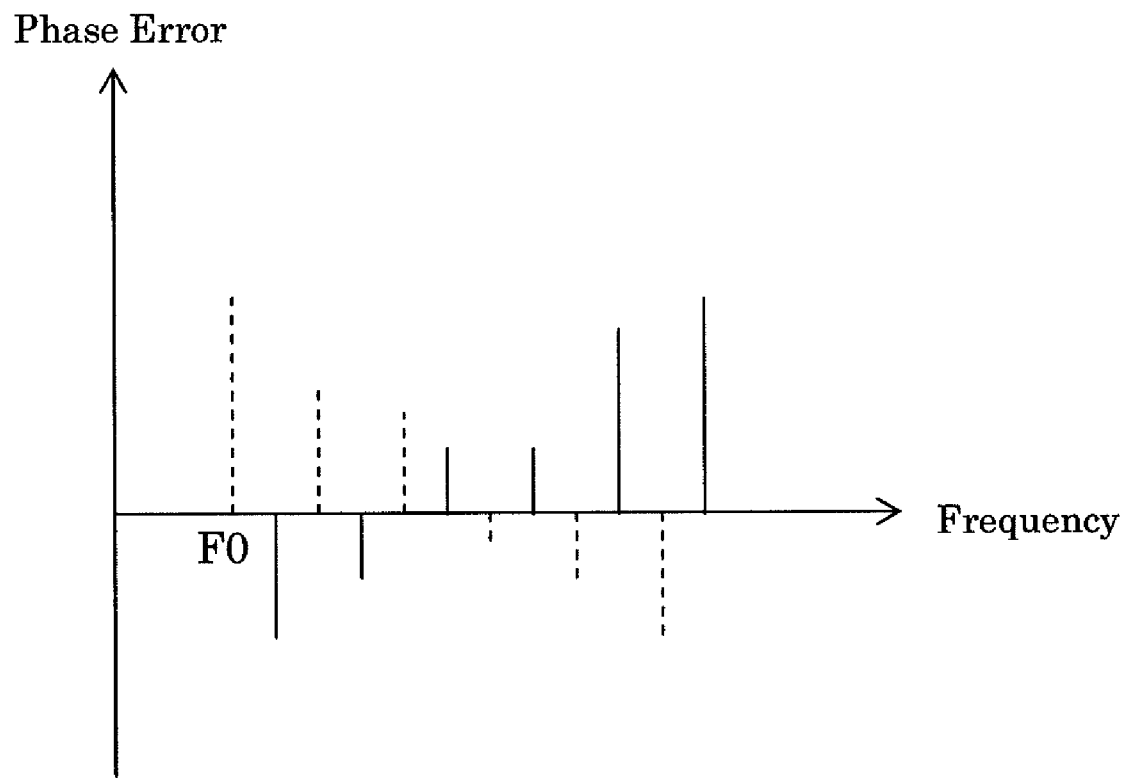
FIG. 12 shows an output from a second signal phase error acquisition unit 264h.

FIG. 11 shows an output from the first signal phase error acquisition unit 262h. FIG. 12 shows an output from the second signal phase error acquisition unit 264h. It should be noted that the signals represented by dotted lines in FIGS. 11 and 12 are not actually output.

As shown in FIG. 11, the first signal phase error acquisition unit 262h acquires the powers of the components having the frequencies F0+n1×ΔF (n1=2 n=0, 2, 4, . . . ) from the phase errors measured by the phase measuring unit 26e, the set phase recording unit 26f, and the phase error deriving unit 26g. As shown in FIG. 3(b), the frequencies assigned to the frequency-different signal 12a are represented as F0+n1×ΔF, and the signal to be measured obtained by modulating the frequency-different signal 12a is output from the output terminal 18a. The first signal phase error acquisition unit 262h thus acquires the phase error corresponding to the output terminal 18a from the phase errors measured by the phase measuring unit 26e, the set phase recording unit 26f, and the phase error deriving unit 26g.

As shown in FIG. 12, the second signal phase error acquisition unit 264h acquires the powers of the components having the frequencies F0+n2×ΔF (n2=2 n+1=1, 3, 5, . . . ) from the phase errors measured by the phase measuring unit 26e, the set phase recording unit 26f, and the phase error deriving unit 26g. As shown in FIG. 3(c), the frequencies assigned to the frequency-different signal 12b are represented as F0+n2×ΔF, and the signal to be measured obtained by modulating the frequency-different signal 12b is output from the output terminal 18b. The second signal phase error acquisition unit 264h thus acquires the phase error corresponding to the output terminal 18b from the phase errors measured by the phase measuring unit 26e, the set phase recording unit 26f, and the phase error deriving unit 26g.

The first phase error averaging unit (characteristic deriving means) 262j averages the results acquired by the first signal phase error acquisition unit 262h. This average is the average of the phase errors corresponding to the output terminal 18a. The average of the phase errors corresponding to the output terminal 18a can be considered as a phase characteristic of the signal output from the output terminal 18a. It is thus considered that the first phase error averaging unit 262j derives a phase characteristic of the signal output from the output terminal 18a.

The second phase error averaging unit (characteristic deriving means) 264j averages the results acquired by the second signal phase error acquisition unit 264h. This average is the average of the phase errors corresponding to the output terminal 18b. The average of the phase errors corresponding to the output terminal 18b can be considered as a phase characteristic of the signal output from the output terminal 18b. It is thus considered that the second phase error averaging unit 264j derives a phase characteristic of the signal output from the output terminal 18b.

The phase difference deriving unit (difference acquisition means) 26k derives a difference between an output from the first phase error averaging unit 262j and an output from the second phase error averaging unit 264j. In other words, the phase difference deriving unit 26k derives a difference between the average of the phase errors corresponding to the output terminal 18a and the average of the phase errors corresponding to the output terminal 18b. This difference is referred to as phase difference. The phase difference represents the difference between the phase characteristic of the signal output from the output terminal 18a and the phase characteristic of the signal output from the output terminal 18b. It is considered that the phase difference deriving unit 26k acquires this difference.

According to the second embodiment, the frequencies are assigned to the frequency-different signal 12a as shown in FIG. 3(b), and the frequencies are assigned to the frequency-different signal 12b as shown in FIG. 3(c). Then, the transmission signal measuring device 2 acquires the phase errors of the frequency components used by the frequency-different signals 12a and 12b, thereby acquiring the phase difference. As a result, since it is possible to reduce a labor for switching from the connection between the output terminal 18a and the transmission signal measuring device 2 to the connection between the output terminal 18b and the transmission signal measuring device 2, and vice versa, the difference between the outputs from the multiple terminals (output terminals 18a and 18b) can be easily measured.

The second embodiment is described assuming that the bisecting unit 12 outputs two signals. However, the second embodiment can be applied to a case in which the bisecting unit 12 outputs N of signals.

In this case, N of the phase error acquisition units and phase error averaging units are respectively necessary. Moreover, the phase difference deriving unit 26k derives a difference between an output from one phase error averaging unit and an output from another phase error averaging unit.

For example, when N=4, four of the phase error acquisition units: a first signal phase error acquisition unit (for acquiring the phase errors of a signal having frequencies F0+m×4×ΔF); a second signal phase error acquisition unit (for acquiring the phase errors of a signal having frequencies F0+(m×4+1)×ΔF); a third signal phase error acquisition unit (for acquiring the phase errors of a signal having frequencies F0+(m×4+2)×ΔF); and a fourth signal phase error acquisition unit (for acquiring the phase errors of a signal having frequencies F0+(m×4+3)×ΔF) are necessary. The signal with the frequencies of F0+m×4×ΔF, the signal with the frequencies of F0+(m×4+1)×ΔF, the signal with the frequencies of F0+(m×4+2)×ΔF, and the signal with the frequencies of F0+(m×4+3)×ΔF are respectively output from different output terminals. Thus, the phase error acquisition units acquire the phase errors corresponding to the respective output terminals (output-terminal-corresponding data).

Moreover, four of the phase error averaging units: a first signal phase error averaging unit (for averaging results acquired by the first signal phase error acquisition unit); a second signal phase error averaging unit (for averaging results acquired by the second signal phase error acquisition unit); a third signal phase error averaging unit (for averaging results acquired by the third signal phase error acquisition unit); and a fourth signal phase error averaging unit (for averaging results acquired by the fourth signal phase error acquisition unit), are necessary.

Further, the phase difference deriving unit 26k derives a difference between an output from one phase error averaging unit (such as the first signal phase error averaging unit) and an output from another phase error averaging unit (such as the third signal phase error averaging unit).

THIRD EMBODIMENT

The third embodiment is to measure a difference in delay between the output from the output terminal 18a and the output from the output terminal 18b. It should be noted that the frequency-different signal 12a and the frequency-different signal 12b have no time lag relative to each other, resulting in no difference in delay. As a result, ideally, there is no difference in delay between the signal output from the output terminal 18a and the signal output from the output terminal 18b. It is assumed that the outputs from both of the signals ideally start at a predetermined time point t0. It is assumed that the bisecting unit 12 outputs the two signals.

Figure 13:
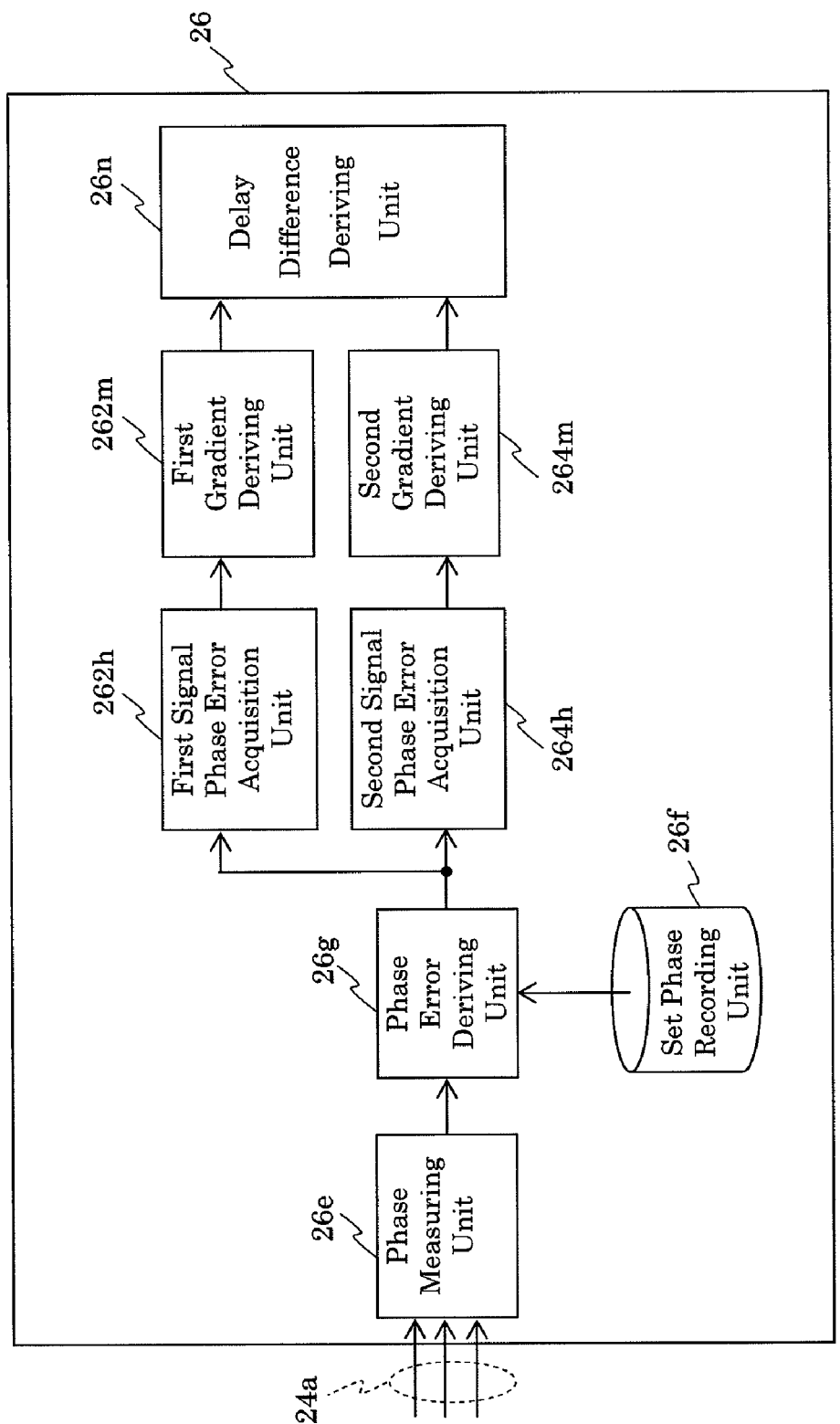
FIG. 13 is a functional block diagram showing a configuration of the characteristic measuring unit 26 according to the third embodiment.

FIG. 13 is a functional block diagram showing a configuration of the characteristic measuring unit 26 according to the third embodiment. The characteristic measuring unit 26 according to the third embodiment includes the phase measuring unit (measuring means) 26e, the set phase recording unit (measuring means) 26f, the phase error deriving unit (measuring means) 26g, the first signal phase error acquisition unit (corresponding data acquiring means) 262h, the second signal phase error acquisition unit (corresponding data acquiring means) 264h, a first gradient deriving unit (characteristic deriving means) 262m, a second gradient deriving unit (characteristic deriving means) 264m, and a delay difference deriving unit (difference acquisition means) 26n. In the following section, the same components are denoted by the same numerals as of the second embodiment, and will be explained in no more details.

The phase measuring unit 26e, the set phase recording unit 26f, the phase error deriving unit 26g, the first signal phase error acquisition unit 262h, and the second signal phase error acquisition unit 264h are the same as those of the second embodiment, and will be explained in no more details.

Figure 14:
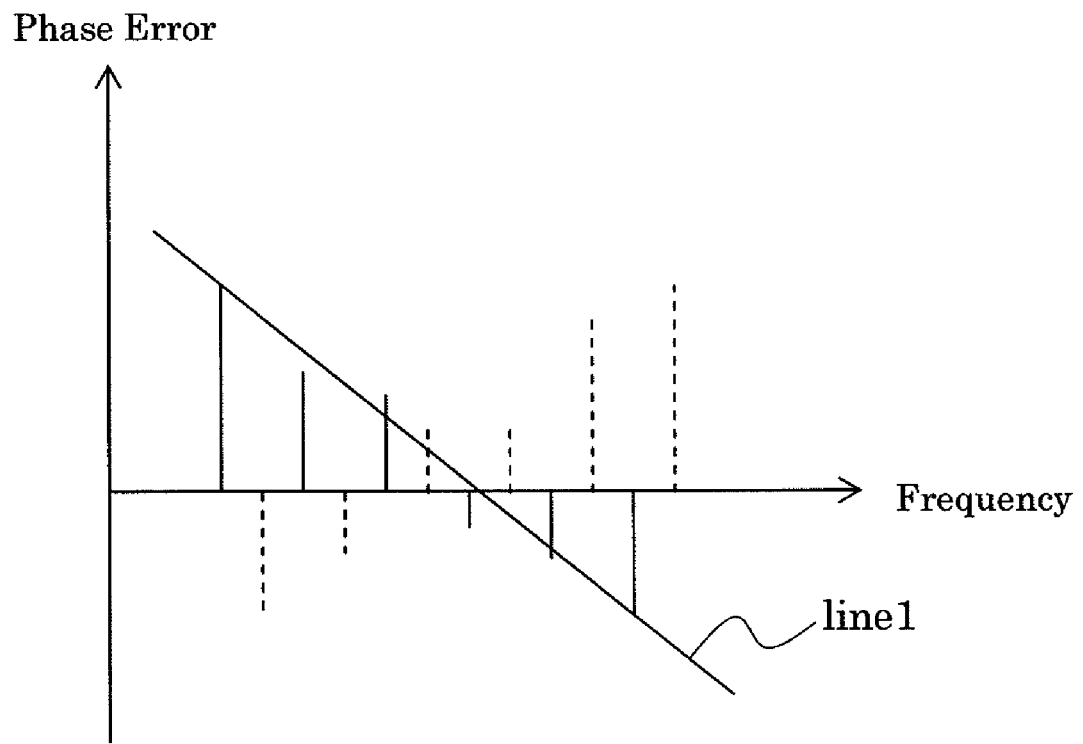
FIG. 14 shows an output from the first signal phase error acquisition unit 262h.
Figure 15:
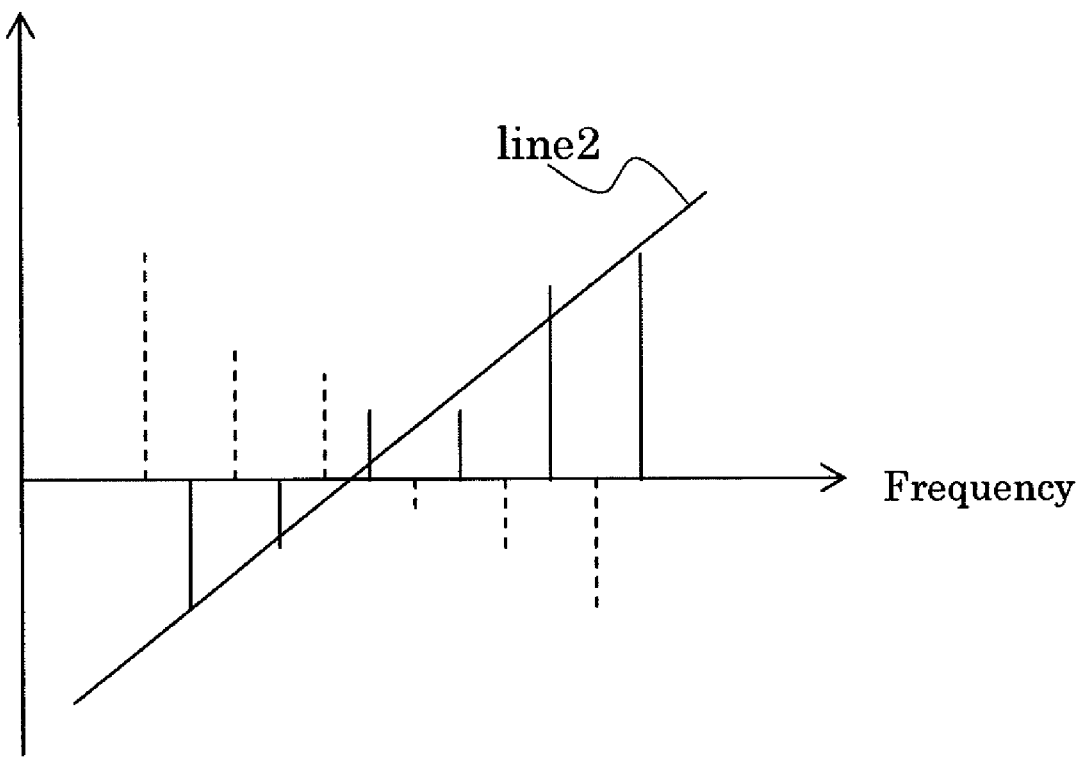
FIG. 15 shows an output from the second signal phase error acquisition unit 264h

FIG. 14 shows an output from the first signal phase error acquisition unit 262h. The output itself from the first signal phase error acquisition unit 262h is the same as that according to the second embodiment. FIG. 15 shows an output from the second signal phase error acquisition unit 264h. The output itself of the second signal phase error acquisition unit 264h is the same as that according to the second embodiment.

The first gradient deriving unit (characteristic deriving means) 262m derives a rate of change in phase error corresponding to the output terminal 18a in terms of frequency. Specifically, the first gradient deriving unit 262m obtains the gradient of a segment line1 in FIG. 14. It should be noted that the segment line1 is a result by approximating the output of the first signal phase error acquisition unit 262h by a straight line according to the least square method. The value derived by the first gradient deriving unit 262m represents how much a time point at which the output of the signal to be output from the output terminal 18a starts is delayed from the predetermined time point to (referred to as "delay time").

The second gradient deriving unit (characteristic deriving means) 264m derives a rate of change in phase error corresponding to the output terminal 18b in terms of frequency. Specifically, the second gradient deriving unit 264m obtains the gradient of a segment line2 in FIG. 15. It should be noted that the segment line2 is a result by approximating the outputs of the second signal phase error acquisition unit 264h by a straight line according to the least square method. The value derived by the second gradient deriving unit 264m represents how much a time point at which the output of the signal to be output from the output terminal 18b starts is delayed from the predetermined time point t0 (referred to as "delay time").

The delay difference deriving unit (difference acquisition means) 26n derives a difference between the output from the first gradient deriving unit 262m and the output from the second gradient deriving unit 264m. In other words, the delay difference deriving unit 26n derives a difference between the delay time of the signal output from the output terminal 18a and the delay time of the signal output from the output terminal 18b. This difference is referred to as delay difference. The delay difference represents a difference between a delay characteristic of the signal output from the output terminal 18a and a delay characteristic of the signal output from the output terminal 18b. It is considered that the delay difference deriving unit 26n acquires this difference.

According to the third embodiment, the frequencies are assigned to the frequency-different signal 12a as shown in FIG. 3(b), and the frequencies are assigned to the frequency-different signal 12b as shown in FIG. 3(c). Then, the transmission signal measuring device 2 acquires the phase errors of the frequency components used by the frequency-different signals 12a and 12b, thereby acquiring the delay difference. As a result, since it is possible to reduce a labor for switching from the connection between the output terminal 18a and the transmission signal measuring device 2 to the connection between the output terminal 18b and the transmission signal measuring device 2, and vice versa, the difference between the outputs from the multiple terminals (output terminals 18a and 18b) can be easily measured.

The third embodiment is described assuming that the bisecting unit 12 outputs two signals. However, the third embodiment can be applied to a case in which the bisecting unit 12 outputs N of signals.

In this case, N of the phase error acquisition units and gradient deriving units are respectively necessary. Moreover, the delay difference deriving unit 26n derives a difference between an output from one gradient deriving unit and an output from another gradient deriving unit.

For example, when N=4, four of the phase error acquisition units: a first signal phase error acquisition unit (for acquiring the phase errors of a signal having frequencies $F0+m\times 4\times \Delta F$); a second signal phase error acquisition unit (for acquiring the phase errors of a signal having frequencies $F0+(m\times 4+1)\times \Delta F$); a third signal phase error acquisition unit (for acquiring the phase errors of a signal having frequencies $F0+(m\times 4+2)\times \Delta F$); and a fourth signal phase error acquisition unit (for acquiring the phase errors of a signal having frequencies $F0+(m\times 4+3)\times \Delta F$) are necessary. The signal with the frequencies of $F0+m\times 4\times \Delta F$, the signal with the frequencies of $F0+(m\times 4+1)\times \Delta F$, the signal with the frequencies of $F0+(m\times 4+2)\times \Delta F$, and the signal with the frequencies of $F0+(m\times 4+3)\times \Delta F$ are respectively output from different output terminals. Thus, the phase error acquisition units acquire the phase errors corresponding to the respective output terminals (output-terminal-corresponding data).

Moreover, four of the gradient deriving units: a first gradient deriving unit (for deriving a rate of change in results acquired by the first signal phase error acquisition unit in terms of frequency); a second gradient deriving unit (for deriving a rate of change in results acquired by the second signal phase error acquisition unit in terms of frequency); a third gradient deriving unit (for deriving a rate of change in results acquired by the third signal phase error acquisition unit in terms of frequency); and a fourth gradient deriving unit (for deriving a rate of change in results acquired by the fourth signal phase error acquisition unit in terms of frequency), are necessary.

Moreover, the delay difference deriving unit 26n derives a difference between an output from one gradient deriving unit (such as the first gradient deriving unit) and an output from another gradient deriving unit (such as the third gradient deriving unit).

Further, the above-described embodiments may be realized in the following manner. A computer is provided with a CPU, a hard disk, and a media (such as a floppy disk (registered trade mark) and a CD-ROM) reader, and the media reader is caused to read a medium recording a program realizing the functions of the above-described respective components (such as the characteristic measuring unit 26), thereby installing the program on the hard disk. This method may also realize the above-described functions.

The invention claimed is:

1. A signal measuring device for measuring signals which are generated by modulating frequency-different signals that are different in frequency from each other, and are respectively output from different output terminals, comprising:
   a combiner that combines the signals that are respectively output from the different output terminals;
   a demodulator that demodulates a result of combining carried out by the combiner;
   a measurer that measures measured data for respective frequencies of a result of demodulation carried out by the demodulator;
   a corresponding data acquirer that acquires output-terminal-corresponding data, which corresponds to the different output terminals, based on the measured data;
   a characteristic deriver that derives characteristics of the different output terminals based on the output-terminal-corresponding data; and
   a difference acquirer that acquires a difference in the characteristics between the different output terminals based on the characteristics derived by the characteristic deriver.

2. The signal measuring device according to claim 1, wherein the frequency-different signals comprise a first signal having odd frequencies of frequencies arranged at an equal interval, and a second signal having even frequencies of the frequencies arranged at the equal interval.

3. The signal measuring device according to claim 2, wherein the frequency-different signals have equal electric power with respect to each other, the measured data is the electric power, the characteristic deriver derives averages of the output-terminal-corresponding data, and the difference acquirer acquires a ratio between the averages.

4. The signal measuring device according to claim 2, wherein the frequency-different signals have equal phase with respect to each other, the measured data is a quantity representing the phase, the characteristic deriver derives averages of the output-terminal-corresponding data, and the difference acquirer acquires a difference between the averages.

5. The signal measuring device according to claim 2, wherein the frequency-different signals have no time lag relative to each other, the measured data is a quantity representing a phase, the characteristic deriver derives rates of change in the output-terminal-corresponding data in terms of frequency, and the difference acquirer acquires a difference between the rates of change.

6. The signal measuring device according to claim 1, wherein the frequency-different signals have equal electric power with respect to each other, the measured data is the electric power, the characteristic deriver derives averages of the output-terminal-corresponding data, and the difference acquirer acquires a ratio between the averages.

7. The signal measuring device according to claim 1, wherein the frequency-different signals have equal phase with respect to each other, the measured data is a quantity representing the phase, the characteristic deriver derives averages of the output-terminal-corresponding data, and the difference acquirer acquires a difference between the averages.

8. The signal measuring device according to claim 1, wherein the frequency-different signals have no time lag relative to each other, the measured data is a quantity representing a phase, the characteristic deriver derives rates of change in the output-terminal-corresponding data in terms of frequency, and the difference acquirer acquires a difference between the rates of change.

9. A signal measuring method for measuring, with a computer, signals which are generated by modulating frequency-different signals that are different in frequency from each other, and are respectively output from different output terminals, comprising:

combining the signals that are respectively output from the different output terminals;

demodulating a result of the combining;

measuring, via a processor of the computer, measured data for respective frequencies of a result of the demodulating;

acquiring, via the processor of the computer, output-terminal-corresponding data, which corresponds to the different output terminals, based on the measured data;

deriving, via the processor of the computer, characteristics of the different output terminals based on the output-terminal-corresponding data; and acquiring, via the processor of the computer, a difference in the characteristics between the different output terminals based on the characteristics derived by the deriving.

10. A program of instructions tangibly embodied on a non-transitory computer-readable medium for execution by a computer to perform a signal measuring process in a signal measuring device for measuring signals which are generated by modulating frequency-different signals that are different in frequency from each other, and are respectively output from different output terminals, the computer having: a combiner that combines the signals that are respectively output from the different output terminals; and a demodulator that demodulates a result of combining carried out by the combiner, said signal measuring process comprising:

measuring measured data for respective frequencies of a result of demodulation carried out by the demodulator;

acquiring output-terminal-corresponding data, which corresponds to the different output terminals, based on the measured data;

deriving characteristics of the different output terminals based on the output-terminal-corresponding data; and acquiring a difference in the characteristics between the different output terminals based on the characteristics derived by the deriving.

11. A non-transitory computer-readable medium having a program of instructions for execution by a computer to perform a signal measuring process in a signal measuring device for measuring signals which are generated by modulating frequency-different signals that are different in frequency from each other, and are respectively output from different output terminals, the computer having: a combiner that combines the signals that are respectively output from the different output terminals; and a demodulator that demodulates a result of combining carried out by the combiner, said signal measuring process comprising:

measuring measured data for respective frequencies of a result of demodulation carried out by the demodulator;

acquiring output-terminal-corresponding data, which corresponds to the different output terminals, based on the measured data;

deriving characteristics of the different output terminals based on the output-terminal-corresponding data; and acquiring a difference in the characteristics between the different output terminals based on the characteristics derived by the deriving.

* * * * *